(12) United States Patent
Agostini et al.

(10) Patent No.: US 9,032,743 B2
(45) Date of Patent: May 19, 2015

(54) HEAT EXCHANGER

(75) Inventors: Bruno Agostini, Zurich (CH); Matti Kauranen, Zürich (FI)

(73) Assignee: ABB Research Ltd, Zurich (CH)

( * ) Notice: Subject to any disclaimer, the term of this patent is extended or adjusted under 35 U.S.C. 154(b) by 330 days.

(21) Appl. No.: 13/601,115

(22) Filed: Aug. 31, 2012

(65) Prior Publication Data

US 2013/0233014 A1    Sep. 12, 2013

(30) Foreign Application Priority Data

Sep. 6, 2011   (EP) .................................... 11180185

(51) Int. Cl.
*F28D 15/02*       (2006.01)
*F25B 39/00*       (2006.01)
*F28D 15/04*       (2006.01)
*H05K 7/20*        (2006.01)

(52) U.S. Cl.
CPC ............ *F25B 39/00* (2013.01); *F28D 15/0266* (2013.01); *F28D 15/04* (2013.01); *H05K 7/20309* (2013.01); *H05K 7/20336* (2013.01); *H05K 7/20936* (2013.01); *F28D 15/0233* (2013.01); *F28D 15/0275* (2013.01)

(58) Field of Classification Search
USPC ............. 62/119; 165/104.21, 104.26, 104.29, 165/104.33
See application file for complete search history.

(56) References Cited

U.S. PATENT DOCUMENTS

| | | | |
|---|---|---|---|
| 6,452,217 B1 | 9/2002 | Wojnarowski et al. | |
| 7,069,975 B1 | 7/2006 | Haws et al. | |
| 8,405,992 B2 | 3/2013 | Yesin et al. | |
| 2001/0042614 A1* | 11/2001 | Okamoto | 165/104.21 |
| 2004/0012983 A1 | 1/2004 | Fearing et al. | |
| 2004/0112572 A1* | 6/2004 | Moon et al. | 165/104.21 |
| 2004/0145048 A1 | 7/2004 | Frisch et al. | |
| 2005/0007740 A1 | 1/2005 | Neuschuetz et al. | |
| 2006/0293086 A1 | 12/2006 | Haws et al. | |
| 2007/0153474 A1 | 7/2007 | Andersen et al. | |
| 2007/0253163 A1 | 11/2007 | Naghi et al. | |
| 2007/0284088 A1* | 12/2007 | Chun | 165/104.21 |
| 2008/0084666 A1 | 4/2008 | Kehl et al. | |

(Continued)

FOREIGN PATENT DOCUMENTS

| | | |
|---|---|---|
| CN | 101377392 A | 3/2009 |
| CN | 201255596 Y | 6/2009 |

(Continued)

OTHER PUBLICATIONS

An English-Language translation of the Office Action and Search Report issued Aug. 1, 2014, by the State Intellectual Property Office of People's Republic of China in corresponding Chinese Patent Application No. 201210280911.5. (5 pages).

(Continued)

*Primary Examiner* — Cassey D Bauer
(74) *Attorney, Agent, or Firm* — Buchanan Ingersoll & Rooney PC

(57) ABSTRACT

The disclosure relates to a heat exchanger including an evaporator with a pair of base plates, each base plate having a first surface with channels extending from a manifold at a first end of the evaporator to a manifold at a second end of the evaporator, some of the channels are embedded into the base plate and some of the channels are arranged outside of base plate, a condenser with channels extending from a manifold at a first end of the condenser to a manifold at a second end of the condenser, at least one riser pipe and at least one return pipe.

11 Claims, 3 Drawing Sheets

(56) References Cited

U.S. PATENT DOCUMENTS

| | | |
|---|---|---|
| 2009/0056916 A1 | 3/2009 | Yesin et al. |
| 2009/0284923 A1 | 11/2009 | Rytka et al. |
| 2011/0030400 A1 | 2/2011 | Agostini et al. |
| 2011/0080711 A1 | 4/2011 | Yesin et al. |
| 2011/0127011 A1 | 6/2011 | Agostini et al. |
| 2011/0164340 A1 | 7/2011 | Takeda |
| 2013/0075076 A1 | 3/2013 | Agostini et al. |

FOREIGN PATENT DOCUMENTS

| | | |
|---|---|---|
| DE | 101 57 671 A1 | 6/2003 |
| DE | 102 50 604 A1 | 5/2004 |
| EP | 1 909 549 A2 | 4/2008 |
| EP | 2 031 332 A1 | 3/2009 |
| EP | 2 282 624 A1 | 2/2011 |
| EP | 2 327 947 A1 | 6/2011 |
| EP | 2 328 172 A1 | 6/2011 |
| EP | 2 361 006 A2 | 8/2011 |
| WO | WO 01/20713 A1 | 3/2001 |
| WO | WO 2007/009868 A1 | 1/2007 |

OTHER PUBLICATIONS

Office Action issued on Aug. 20, 2013, by the European Patent Office in corresponding European Patent Application No. 12 174 921.2. (7 pages).
Chinese Office Action dated Dec. 24, 2013, issued by the State Intellectual Property Office of the People's Republic of China in corresponding Chinese Patent Application No. 201210280911.5, and English language translation of Office Action. (15 pages).
European Search Report (EPO Form 1507N) issued Jan. 23, 2012.
European Search Report (EPO Form 1507N) issued May 8, 2012.

* cited by examiner

HEAT EXCHANGER

RELATED APPLICATION(S)

This application claims priority under 35 U.S.C. §119 to European Patent Application No. 11180185.8 filed in Europe on Sep. 6, 2011, the entire content of which is hereby incorporated by reference in its entirety.

FIELD

The present disclosure relates to a heat exchanger and for example, to a heat exchanger for use in cooling electronic apparatuses.

BACKGROUND INFORMATION

A known heat exchanger has evaporator channels and condenser channels extending between a first and a second end of the heat exchanger. The opposite ends of the heat exchanger are provided with connecting parts that provide fluid paths between the evaporator channels and the condenser channels. A first heat transfer element is arranged in a vicinity of the first end of the heat exchanger for transferring heat load to a fluid in the evaporator channels. Similarly, a second heat transfer element is arranged in a vicinity of the second end of the heat exchanger for transferring heat load from a fluid in the condenser channels to the surroundings.

The above-described heat exchanger can be efficient in cooling down, for example, power electronics attached to the first heat transfer element. Due to a thermosyphon type construction, cooling can be achieved without needing a pumping unit.

However, the channels of the heat exchanger can be vulnerable to external damage where a fluid leak may occur, which in turn can lead to damage due to absence of cooling. Additionally it can be difficult to ensure even distribution of the fluid both in the condenser and in the evaporator.

SUMMARY

A heat exchanger is disclosed comprising an evaporator for receiving a heat load and the evaporator comprises a pair of base plates each base plate having a first surface with channels extending from a manifold at a first end of the evaporator to a manifold at a second end of the evaporator, some of the channels are embedded into the base plate and some of the channels are arranged outside of said base plate. The pair of base plates of the evaporator are arranged with their respective first surfaces towards each other. A condenser for passing a heat load to surroundings, the condenser comprising channels extending from a manifold at a first end of the condenser to a manifold at a second end of the condenser, pipes connecting the evaporator and condenser to each other in order to pass fluid between the evaporator and condenser. At least one riser pipe connecting the manifold at the second end of the evaporator to the manifold at the second end of the condenser and at least one return pipe connecting the manifold at the first end of the condenser to the manifold at the first end of the evaporator.

BRIEF DESCRIPTION OF DRAWINGS

In the following, the present disclosure will be described in more detail by way of example and with reference to the attached drawings, in which.

DETAILED DESCRIPTION

The use of a pair of base plates with channels on a respective first surface such that the first surfaces of the plates are turned to face each other, can result in a heat exchanger with an evaporator that is mechanically well protected against external shocks. Due to the connections between the evaporator and the condenser, uniform fluid distribution and a good thermal efficiency can be obtained.

FIGS. 1 to 5 illustrate a first exemplary embodiment of a heat exchanger 1 according to the disclosure. The heat exchanger includes an evaporator 2 for receiving a heat load and for passing the heat load into fluid in channels of the evaporator 2. The fluid is forwarded to a condenser 3, from where the heat load of the fluid is passed to the surroundings of the condenser 3. The fluid is then returned from the condenser 3 to the evaporator 2.

Figure 1:
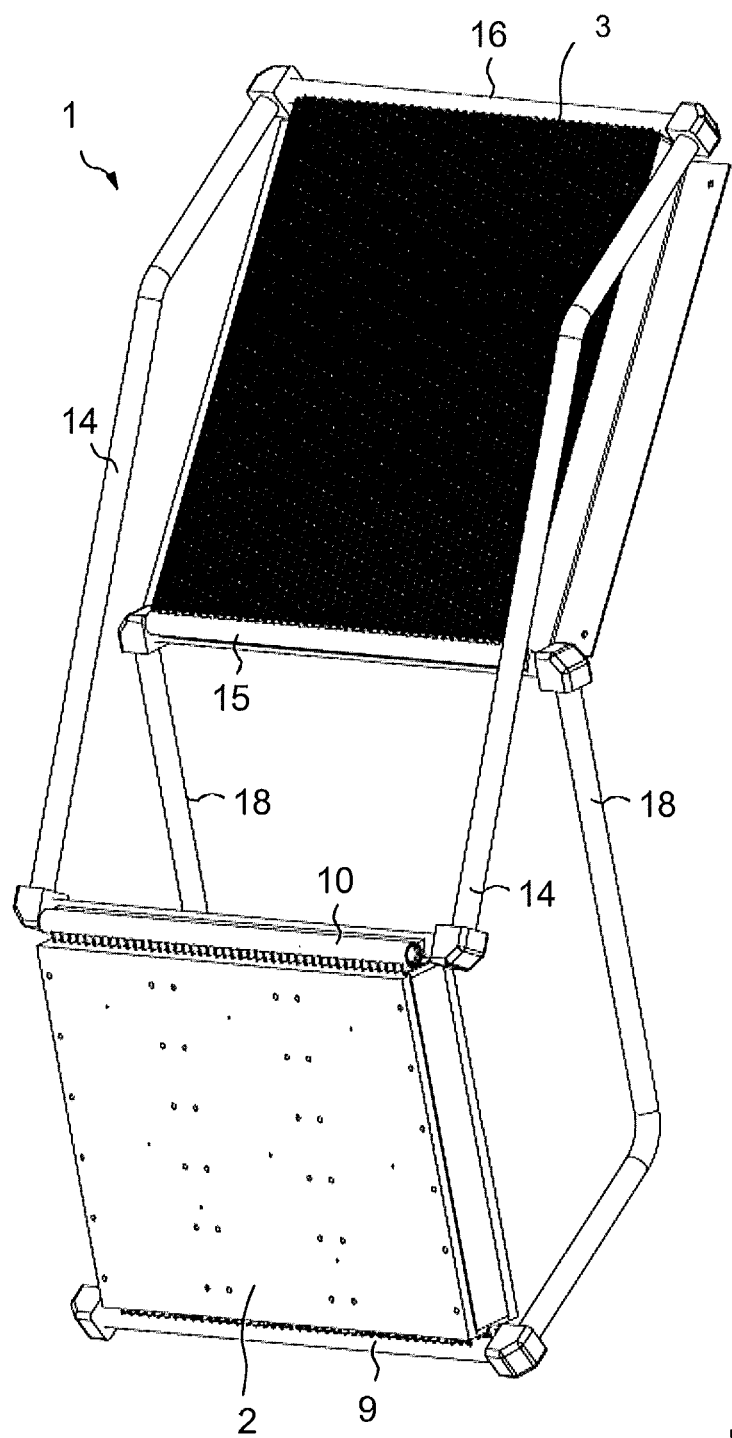
FIG. 1 illustrates an exemplary embodiment of a heat exchanger according to the disclosure.
Figure 2:
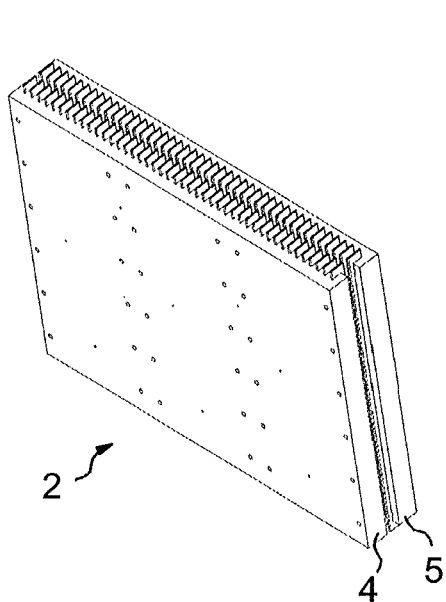
FIGS. 2 and 3 illustrate details of the evaporator of FIG. 1.
Figure 3:
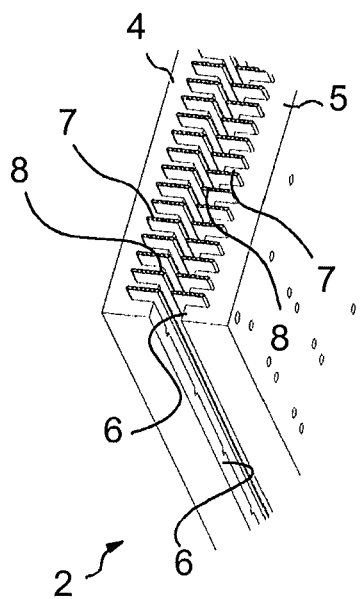

FIGS. 2 and 3 illustrate details of the evaporator 2. The evaporator 2 includes two base plates 4 and 5 with first surfaces 6 turned towards each other. Such an arrangement can be utilized for cooling down electronic components attached to the base plates 4 and 5, for example, in which case the heat exchanger 1 can be utilized in an electronic device like a frequency converter or an inverter. The first surface 6 of both base plates can be provided with channels 7 and 8 extending from a manifold 9 at a first end of the evaporator 2 to a manifold 10 at a second end of the evaporator 2. Some of the channels 7 can be embedded into the base plates 4 and 5 to provide evaporation channels, while the remaining channels 8 can be located outside of the base plates 4 and 5 to provide a return path for non-vaporized liquid that comes out of the evaporation channels 7. In the illustrated example (FIG. 1), the second end (with manifold 10) of the evaporator 2 can be located at a higher level than the first end (with manifold 9) of the evaporator.

In the illustrated example, the channels 7 and 8 can be arranged into pipes whose internal and external walls separate the channels 7 and 8 from each other. In this example the channels can be located within a plurality of MPE (Multi Port Extruded) pipes that are arranged partly into parallel grooves manufactured into the surfaces of the base plates 4 and 5.

The channels 7 and 8 can be of a capillary dimension. In this context "capillary dimension" can refer to channels that are capillary-sized, which means that they have a size small enough for bubbles to grow uniquely in a longitudinal direction (in other words in the longitudinal direction of the channel as opposed to the radial direction) and thereby create a so called bubble lift effect by pushing the liquid. The diameter of a channel or tube which is considered capillary depends on the fluid or refrigerant that is used (boiling) inside. The following formula, for instance, can be used to evaluate a suitable diameter: $D=(sigma/(g*(rhol-rhov)))^{\wedge}0.5$, wherein sigma is the surface tension, g the acceleration of gravity, rhov the vapour density and rhol the liquid density. This formula gives values from 1 to 3 mm for R134a (Tetrafluoroethane), R145fa and R1234ze (Tetrafluoropropene), which are examples of the fluids suitable for use in the heat exchanger illustrated in the figures.

Figure 4:
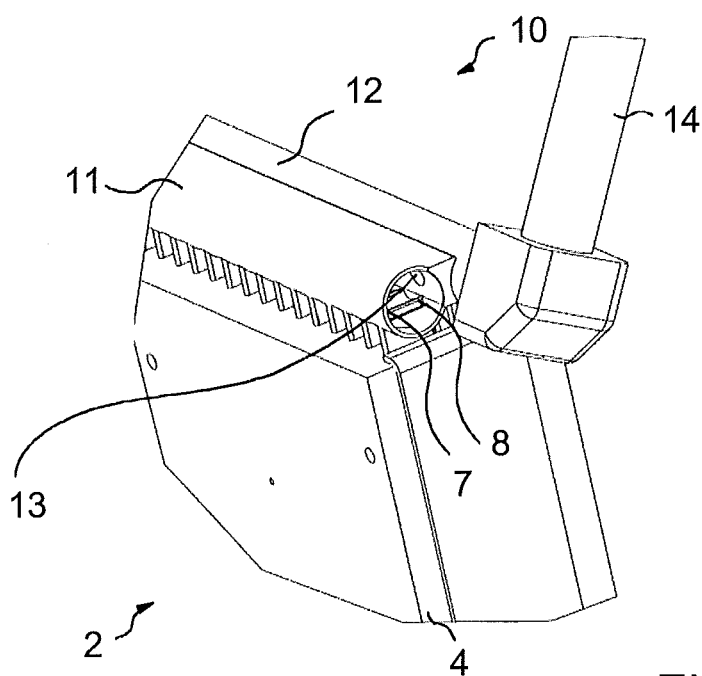
FIG. 4 illustrates a manifold and its connections of FIG. 1.

The first and second ends of the evaporator can be provided with manifolds 9 and 10 which connect the channels 7 and 8 of the evaporator to each other. In FIG. 4, the manifold 10 of the second end of the evaporator 2 is illustrated in more detail. A similar manifold 9 can also be employed in the first end of the evaporator. In the illustrated example, the manifold 10 can include two separate tubes 11 and 12, each connecting the channels 7, 8 of one base plate 4 and 5 to each other. The tubes 11 and 12 have a diameter roughly equivalent to the depth of the MPE pipes containing the channels 7 and 8, and the tubes provide a path for each of the two rows of MPE pipes. In order to provide efficient fluid circulation and an even fluid distribution, the tubes 11 and 12 can be connected to each other by communication ports 13 allowing fluid communication between the tubes 11 and 12. Ideally, the communication ports 13 are as evenly distributed as possible and there should be as many communication ports 13 as possible.

Instead of the illustrated manifolds, it is possible to utilize manifolds including one piece, which contains the functionality of parts 11, 12 and 13. The manifold allows liquid and/or vapor to come/go from/to channels 7,8 and to/from riser pipe 14 and return pipe 18. The manifold creates a path for liquid to go back in the channels of the MPE tubes and it also creates a path for vapor to go to pipes 14.

FIG. 4 also illustrates the attachment of a riser pipe 14 to the second manifold 10 of the evaporator 2. Due to the ports 13 allowing fluid communication between the tubes 11 and 12, it can be sufficient to have only one riser pipe interconnecting the manifold 10 at the second end (upper end in the figures) of the evaporator 2 with the manifold 16 at the second end (upper end in the figures) of the condenser 3. However, in order to provide a more efficient solution, two riser pipes can be connected between the manifold 10 at the second end of the evaporator and the manifold 16 at the second end of the condenser, as illustrated in FIG. 1. Manifolds 10 and 16 and the riser pipes 14 create a path for gas to proceed from the evaporator 2 to the condenser 3.

Figure 5:
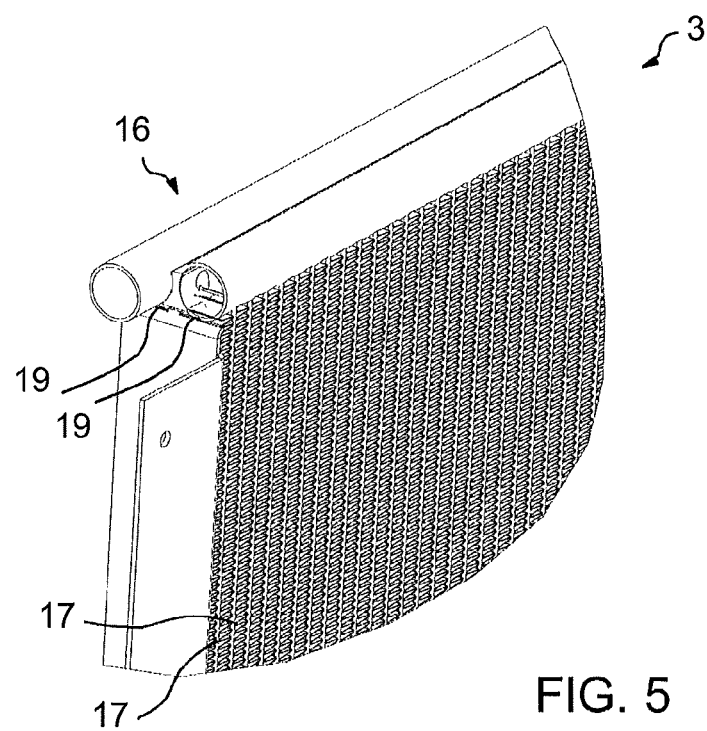
FIG. 5 illustrates details of a condenser of FIG. 1.

The condenser 3 includes channels 17 extending from a manifold 15 at a first end of the condenser 3 to a manifold 16 at a second end of the condenser 3, as illustrated in FIG. 5, for instance. The channels of the condenser 17 can be of capillary dimension, however, this is not necessary in all embodiments. In the illustrated example of FIG. 1, the second end of the condenser 3 can be located at a higher level than the first end of the condenser, and additionally, the first end of the condenser can be located at a higher level than the second end of the evaporator.

In the illustrated example, the condenser and evaporator create a tilt angle. In order for the system to work with gravity and vapor without any pumps the condenser should be located above the evaporator. Otherwise the location of the condenser and evaporator is free. Length and the form of the pipes 14, 18 vary accordingly.

The condenser 3 can be implemented by using a plurality of parallel pipes, such as MPE pipes (arranged in similar rows as illustrated in FIG. 3), whose internal and external walls separate the channels 17 from each other. In the illustrated example, the condenser 3 has been implemented to include two rows 19 of such pipes, and the outer walls of the pipes of each row are interconnected by fins in order to efficiently conduct heat into an air flow passing between the channels 17 on its way through the condenser 3. Consequently, fluid introduced into the manifold 16 at the second end of the condenser 3 is cooled with air or other gas going through the condenser, while the fluid flows to the manifold 15 at the first end of the condenser 3 via the channels 17. The manifolds 15 and 16 may be implemented in the same way as illustrated in FIG. 4, for example, as two separate tubes connected to each other by communication ports.

Instead of having air or another suitable gas flowing between the channels 17 of the condenser, the heat exchanger can be of liquid to liquid type, in which case a fluid flows between the channels. A liquid cooled condenser is previously known from EP-A1-2282624, for example.

The manifold 15 located at the first end (lower end in the figures) of the condenser 3 is connected with a return pipe 18 to the manifold 9 at the first end (lower end in the figures) of the evaporator 2. Due to the communication ports allowing fluid communication between the tubes of the manifolds 9 and 15, a single return pipe 18 can be sufficient. However, in order to provide a more efficient solution, two return pipes 18 can be connected between the manifold 15 at the first end of the condenser 3 and the manifold 9 at the first end of the evaporator, as illustrated in FIG. 1. Manifolds 9 and 15 and the pipes 18 create a path for liquid to go back from the condenser to the evaporator.

Figure 6:
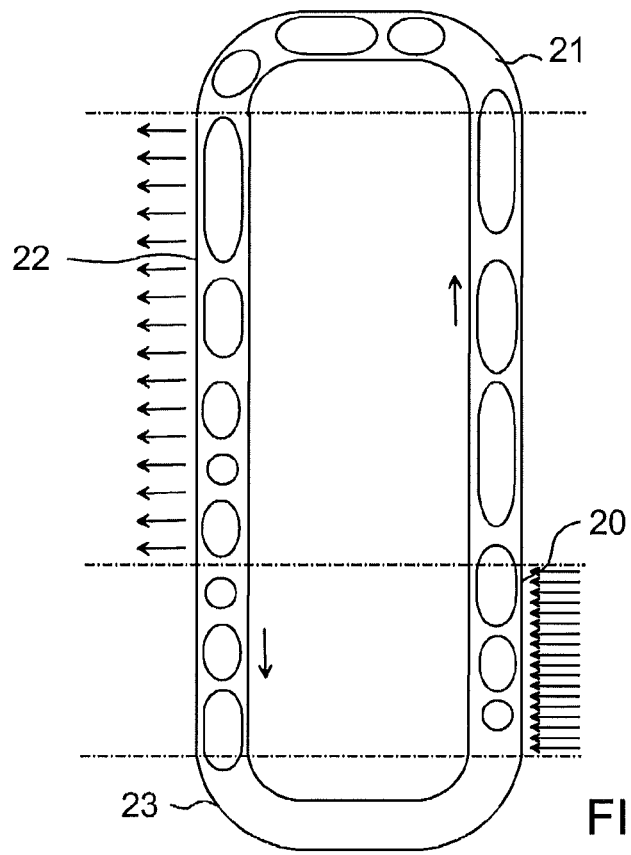
FIG. 6 illustrates a principle of a two-phase thermosyphon.

FIG. 6 illustrates the principle of a two-phase thermosyphon. The heat exchanger illustrated in FIG. 1 may operate according to this principle.

The fluid contained in the channel is heated at the evaporator 20 in order to cause vapour to proceed via the manifold 21 to the condenser 22. At the condenser the heat load is passed to the surroundings and liquid produced due to this is returned via the second manifold 23 to the evaporator 20.

In the illustrated example, the heat exchanger has been made for example, from aluminium. All parts can be cut, milled, bended and/or extruded. The evaporator and the condenser has been manufactured separately with a brazing process. Pipes 14 and 18 are attached to evaporator and condenser by welding. However, it should be observed that many variants exists.

The material can be other than aluminum. For example, copper can be used. However, also other materials can be used and different material can be used in different parts. Materials suitable for use can have good thermal conductivity.

The parts can be manufactured with many different manufacturing processes and the assembly can be done differently than with brazing and welding. Depending on the manufacturing and assembly processes the number of parts can be different than in the illustrated example.

In the illustrated example the main shape of pipes and channels is round. Naturally the shape can also be different depending on the manufacturing process.

It is to be understood that the above description and the accompanying figures are only intended to illustrate the present disclosure. It will be obvious to a person skilled in the art that the disclosure can be varied and modified without departing from the scope of the disclosure.

Thus, it will be appreciated by those skilled in the art that the present invention can be embodied in other specific forms without departing from the spirit or essential characteristics thereof. The presently disclosed embodiments are therefore considered in all respects to be illustrative and not restricted. The scope of the invention is indicated by the appended claims rather than the foregoing description and all changes that come within the meaning and range and equivalence thereof are intended to be embraced therein.

What is claimed is:

1. A heat exchanger, comprising:
an evaporator for receiving a heat load, the evaporator including a pair of base plates, each base plate having a first surface with channels extending from a manifold at a first end of the evaporator to a manifold at a second end of the evaporator, some of the channels are embedded into the base plate and some of the channels are arranged outside of the base plate, the pair of base plates of the evaporator are arranged with their respective first surfaces towards each other;

a condenser for passing a heat load to surroundings, the condenser including channels extending from a manifold at a first end of the condenser to a manifold at a second end of the condenser;

pipes connecting the evaporator and condenser to each other in order to pass fluid between the evaporator and condenser;

at least one riser pipe connecting the manifold at the second end of the evaporator to the manifold at the second end of the condenser; and at least one return pipe connecting the manifold at the first end of the condenser to the manifold at the first end of the evaporator; and wherein at least the first or second end of the evaporator comprises a manifold including two separate tubes, each interconnecting ends of the channels of one base plate to each other, the tubes are connected to each other by communication ports allowing fluid communication between the tubes.

2. The heat exchanger according to claim 1, wherein at least one of the evaporator and condenser has channels of a capillary dimension.

3. The heat exchanger according to claim 1, wherein the channels of the respective first surfaces of the pair of base plates are arranged into pipes whose internal walls separate the channels from each other, the pipes partly penetrating into the first surface of the base plate.

4. The heat exchanger according to claim 1, wherein the manifold at the second end of the evaporator is located at a higher level than the manifold at the first end of the evaporator, and the manifold at the second end of the condenser is located at a higher level than the manifold at the first end of the condenser.

5. The heat exchanger according to claim 1, comprising:
a cooling gas or liquid for passing between channels of the condenser.

6. The heat exchanger according to claim 1, wherein
in the evaporator, the manifold at the second end is located higher than the manifold at the first end, some of the channels are evaporation channels embedded into the base plates and some of the channels are arranged outside of the base plates to provide a return path for non-vaporized liquid that comes out of the evaporation channels;

the manifold at the second end of the condenser is higher located than the manifold at the first end; and the manifold at the first end of the condenser is located at a higher level than the manifold at the second end of the evaporator.

7. A heat exchanger, comprising:
an evaporator for receiving a heat load, the evaporator including a pair of base plates, each base plate having a first surface with channels extending from a manifold at a first end of the evaporator to a manifold at a second end of the evaporator, some of the channels are embedded into the base plate and some of the channels are arranged outside of the base plate, the pair of base plates of the evaporator are arranged with their respective first surfaces towards each other;

a condenser for passing a heat load to surroundings, the condenser including channels extending from a manifold at a first end of the condenser to a manifold at a second end of the condenser;

pipes connecting the evaporator and condenser to each other in order to pass fluid between the evaporator and condenser;

at least one riser pipe connecting the manifold at the second end of the evaporator to the manifold at the second end of the condenser; and at least one return pipe connecting the manifold at the first end of the condenser to the manifold at the first end of the evaporator, and wherein the channels of the condenser are arranged into pipes whose internal and external walls separate the channels from each other, and the condenser comprises at least two rows of pipes whose internal and external walls separate channels from each other, at least the first or second end of the condenser comprises a manifold including two separate tubes, each interconnecting the channels of one row of pipes to each other, the tubes being connected to each other by communication ports for allowing fluid communication between the tubes.

8. The heat exchanger according to claim 7, wherein the condenser comprises:
fins extending between walls of the pipes.

9. The heat exchanger according to claim 8, wherein the condenser comprises:
at least two rows of pipes whose internal and external walls separate channels from each other, at least the first or second end of the condenser comprises a manifold including two separate tubes, each interconnecting the channels of one row of pipes to each other, the tubes being connected to each other by communication ports for allowing fluid communication between the tubes.

10. A heat exchanger, comprising:
an evaporator for receiving a heat load, the evaporator including a pair of base plates, each base plate having a first surface with channels extending from a manifold at a first end of the evaporator to a manifold at a second end of the evaporator, some of the channels are embedded into the base plate and some of the channels are arranged outside of the base plate, the pair of base plates of the evaporator are arranged with their respective first surfaces towards each other;

a condenser for passing a heat load to surroundings, the condenser including channels extending from a manifold at a first end of the condenser to a manifold at a second end of the condenser;

pipes connecting the evaporator and condenser to each other in order to pass fluid between the evaporator and condenser;

at least one riser pipe connecting the manifold at the second end of the evaporator to the manifold at the second end of the condenser;

at least one return pipe connecting the manifold at the first end of the condenser to the manifold at the first end of the evaporator;

two riser pipes connecting opposite ends of the manifold at the second end of the evaporator to the opposite ends of the manifold at the second end of the condenser; and two return pipes connecting opposite ends of the manifold at the first end of the condenser to opposite ends of the manifold at the first end of the evaporator.

11. A heat exchanger, comprising:
an evaporator for receiving a heat load, the evaporator including a pair of base plates, each base plate having a first surface with channels extending from a manifold at a first end of the evaporator to a manifold at a second end of the evaporator, some of the channels are embedded into the base plate and some of the channels are arranged outside of the base plate, the pair of base plates of the evaporator are arranged with their respective first surfaces towards each other;

a condenser for passing a heat load to surroundings, the condenser including channels extending from a manifold at a first end of the condenser to a manifold at a second end of the condenser;

pipes connecting the evaporator and condenser to each other in order to pass fluid between the evaporator and condenser;

at least one riser pipe connecting the manifold at the second end of the evaporator to the manifold at the second end of the condenser; and at least one return pipe connecting the manifold at the first end of the condenser to the manifold at the first end of the evaporator;

two riser pipes connecting opposite ends of the manifold at an upper end of the evaporator to the opposite ends of the manifold at an upper end of the condenser; and two return pipes connecting opposite ends of the manifold and a lower end of the condenser to opposite ends of the manifold at a lower end of the evaporator.

* * * * *